United States Patent
Kawaguchi et al.

(10) Patent No.: US 10,763,775 B2
(45) Date of Patent: Sep. 1, 2020

(54) DEVICE PROTECTION APPARATUS AND DEVICE PROTECTION METHOD

(71) Applicant: Nissan Motor Co., Ltd., Kanagawa (JP)

(72) Inventors: Shinji Kawaguchi, Kanagawa (JP); Kazushige Namiki, Kanagawa (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 16/634,772

(22) PCT Filed: Jul. 28, 2017

(86) PCT No.: PCT/JP2017/027499
§ 371 (c)(1),
(2) Date: Jan. 28, 2020

(87) PCT Pub. No.: WO2019/021469
PCT Pub. Date: Jan. 31, 2019

(65) Prior Publication Data
US 2020/0212839 A1    Jul. 2, 2020

(51) Int. Cl.
*H02P 29/68* (2016.01)
*H02P 29/62* (2016.01)

(52) U.S. Cl.
CPC ............. *H02P 29/68* (2016.02); *H02P 29/62* (2016.02)

(58) Field of Classification Search
CPC ................................ H02P 29/68; H02P 29/62
USPC .................................................... 318/472, 34
See application file for complete search history.

(56) References Cited

U.S. PATENT DOCUMENTS

| 7,791,300 B2 * | 9/2010 | Katsuyama | ............. H02M 1/32 318/139 |
|---|---|---|---|
| 2008/0144237 A1 | 6/2008 | Hirasawa | |
| 2010/0320951 A1 | 12/2010 | Hasegawa et al. | |

(Continued)

FOREIGN PATENT DOCUMENTS

| DE | 102009001427 A1 | 9/2010 |
| EP | 2765690 A1 | 8/2014 |
| JP | 2006230037 A | 8/2006 |

(Continued)

OTHER PUBLICATIONS

Office Action issued in European Application No. 17919564.9; dated Jun. 26, 2020 (8 pages).

*Primary Examiner* — David Luo
(74) *Attorney, Agent, or Firm* — Osha Liang LLP

(57) ABSTRACT

A device protection apparatus comprising a first sensor for detecting temperature of a refrigerant used for cooling a device including a heat-generation part, a second sensor for detecting temperature of the device, and a controller 10 that applies drive limitation to the device based on a first detected temperature detected by the first sensor and a second detected temperature detected by the second sensor, wherein the controller 10 calculates a temperature difference between the first detected temperature and second detected temperature, applies drive limitation to the device when the temperature difference is higher than a predetermined temperature difference threshold value, and applies drive limitation to the device when the second detected temperature is higher than a predetermined first temperature threshold value.

7 Claims, 12 Drawing Sheets

(56) References Cited

U.S. PATENT DOCUMENTS

2011/0193506 A1    8/2011   Hayashi et al.
2016/0254212 A1    9/2016   Kusaka

FOREIGN PATENT DOCUMENTS

| JP | 2009148079 A | 7/2009 |
| JP | 2010279084 A | 12/2010 |
| JP | 2013215791 A | 10/2013 |
| JP | 2015082869 A | 4/2015 |

\* cited by examiner

DEVICE PROTECTION APPARATUS AND DEVICE PROTECTION METHOD

TECHNICAL FIELD

The present invention relates to a device protection apparatus and a device protection method.

BACKGROUND ART

A method of applying limitation to torque of a motor, in which inverter temperature is detected by a temperature sensor, a temperature variation amount is calculated, correction of the inverter temperature is performed when the temperature variation amount is higher than a threshold value, and also, smoothing processing is performed to the inverter temperature after correction, and when the temperature to which the smoothing processing is performed is higher than an upper limit temperature, a load limitation rate is set is known (Patent Document 1).

PRIOR ART DOCUMENT

Patent Document

[Patent Document 1] JP 2006-230037 A

SUMMARY OF INVENTION

Problems to be Solved by Invention

However, there is a problem that temperature of a heat-generation part becomes too high because the torque limitation at an appropriate timing is not applied when surrounding temperature is very high.

A problem to be solved by the present invention is to provide a device protection apparatus and device protection method that can suppress rise of temperature at the heat-generation part.

Means for Solving Problems

The present invention solves the above problem through detecting each of a temperature of a refrigerant used for cooling a device and a temperature of the device, calculating a temperature difference between the detected temperature of the refrigerant and the detected temperature of the device, applying drive limitation to the device when the temperature difference is higher than a predetermined temperature difference threshold value, and applying drive limitation to the device when the detected temperature of the device is higher than a predetermined temperature threshold value.

Effect of Invention

According to the present invention, rise of temperature at the heat-generation part can be suppressed.

MODE(S) FOR CARRYING OUT THE INVENTION

In the following, embodiments of the present invention will be described based on the drawings. The device protection apparatus according to the present embodiment is an apparatus for suppressing rise of the temperature of a device including a heat-generation body. The device protection apparatus is provided, for example, to a drive system to be installed on a vehicle, and while managing temperature of devices included to the drive system, rise of temperature in the devices is suppressed.

In the following, an example where the device protection apparatus is provided to a drive system for a vehicle will be described. Additionally, provision of the device protection apparatus is not necessarily limited to a drive system and the device protection apparatus may be provided to another system including a heat-generation part. Further, the device protection apparatus may be provided to another system other than vehicles.

Figure 1:
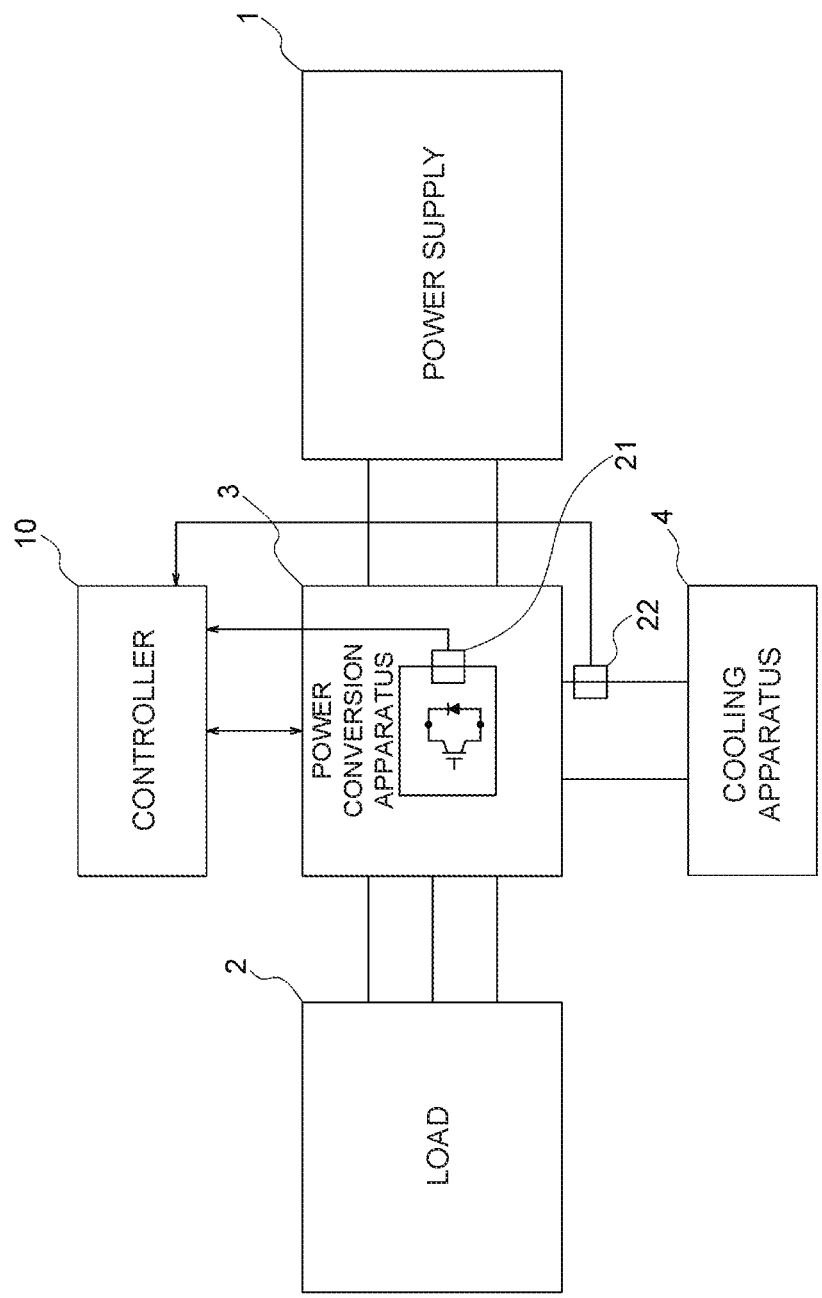
FIG. 1 is a block diagram of a drive system including a device protection apparatus according to the present embodiment.

FIG. 1 is a block diagram of a drive system including the device protection apparatus according to the present embodiment. The drive system includes a power supply 1, a load 2, a power conversion apparatus 3, a cooling apparatus 4, and a controller 10.

The power supply 1 is a power source of a vehicle and is a battery group where secondary batteries, such as lithium ion batteries, are connected in parallel or in series. The load 2 is a motor (electric motor) and is connected to a wheel so as to provide rotational force to the wheel. For the load 2, for example, a three-phase AC motor is used.

The power conversion apparatus 3 is connected between the power supply 1 and the load 2. The power conversion apparatus 3 includes an inverter circuit, control circuit, and the like. The inverter circuit is a circuit enabling two-phase and three-phase conversion connecting a switching element such as IGBT or the like in a bridge form. The inverter circuit is connected between the load 2 and the power supply 1. The inverter circuit is configured by a series circuit connecting a plurality of switching elements in series being connected for three phases in parallel. In the inverter circuit, each the connection point between a switching element of an upper arm and a switching element of a lower arm is connected to an output terminal of an UVW-phase on the motor side. Also, the inverter circuit includes a smoothing capacitor. The smoothing capacitor smooths input and output voltage of the power supply 1 and is connected between a circuit of the switching element in a bridge form and a connection terminal on the power supply 1 side.

The power conversion apparatus 3 includes a temperature sensor 21 for detecting internal temperature of the apparatus. The power conversion apparatus 3 performs power conversion by switching ON and OFF of the switching element included in the inverter circuit. When the switching element performs the ON/OFF operation, heat is generated such as by switching loss, etc. The switching element is modularized as a power module and is installed inside the power conversion apparatus 3. The temperature sensor 21 detects temperature of the power module that increases by switching operation of the switching element. The temperature sensor 21 is provided to the power module. The temperature sensor 21 outputs a detected value to the controller 10. The detected value of the temperature sensor 21 may be output to the controller 10 via a controller inside the power conversion apparatus 3. Also, provision of the temperature sensor 21 is not limited to the power module and the temperature sensor 21 may be provided to the power conversion apparatus 3 in a way temperature of other internal components of the power conversion apparatus 3 can be detected.

The cooling apparatus 4 cools the power conversion apparatus 3 by circulating refrigerant inside the power conversion apparatus 3. The cooling apparatus 4 includes a pump for outputting the refrigerant, a regulating valve for adjusting the amount of refrigerant, a heat exchanger, and the like. The cooling apparatus 4 and the power conversion apparatus 3 are connected by a channel that flows the refrigerant. The channel is formed so as to exit from the cooling apparatus 4, go through inside the power conversion apparatus 3, and return to the cooling apparatus 4. The refrigerant is used for cooling the power module and is a liquid such as water or the like, a refrigerant gas, or the like.

The cooling apparatus 4 includes a temperature sensor 22 for detecting temperature of the refrigerant. The temperature sensor 22 is provided to the channel. The temperature sensor 22 outputs a detected value to the controller 10.

The controller 10 is a computer for executing control processing of the device protection apparatus and by controlling the power conversion apparatus 3 based on the detected temperature of the temperature sensor 21 and detected temperature of the temperature sensor 22, protects the power conversion apparatus 3. The controller 10 includes a Read Only Memory (ROM) to which a program for executing the control for protecting the power conversion apparatus 3, a Central Processing Unit (CPU) for executing the program stored in the ROM, and a Random Access Memory (RAM) that functions as an accessible storage device. The controller 10 is connected to the controller inside the power conversion apparatus 3 by a signal line. More, the controller 10 may be installed within the power conversion apparatus 3 and the controller 10 may include a function to control switching operation. Also, the controller 10 may directly control the switching element within the power module.

Figure 2:
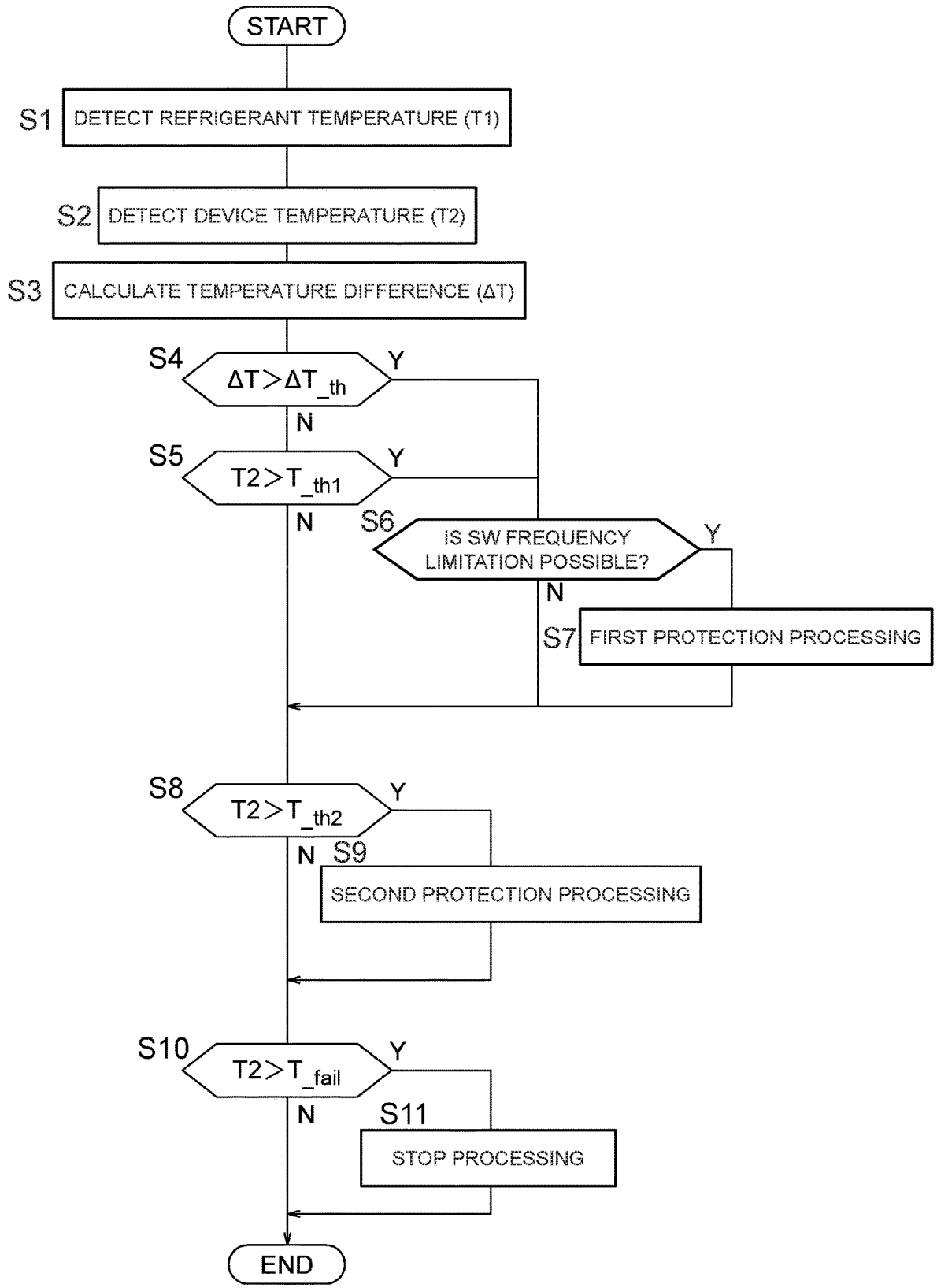
FIG. 2 is a flowchart showing a control flow of the device protection apparatus.

Next, a control flow for protecting the power conversion apparatus 3 by the controller 10 will be explained using FIG. 2. The controller 10 executes the following control flow in a predetermined cycle while the power conversion apparatus 3 is driven.

In Step S1, the controller 10 detects a refrigerant temperature (T1) using the temperature sensor 22. In Step S2, the controller 10 detects temperature of the power module (device temperature: T2) of the power conversion apparatus 3 using the temperature sensor 21.

In Step S3, by determining a difference between the detected refrigerant temperature (T1) and the detected device temperature (T2), the controller 10 calculates a temperature difference ($\Delta T = T2 - T1$).

In Step S4, the controller 10 compares the temperature difference and a predetermined temperature difference threshold value ($\Delta T_{th}$). The temperature difference threshold value ($\Delta T_{th}$) is a threshold value set in advance. As described later, when the environmental temperature is low, the speed of rise in the device temperature is faster than the speed of rise in the refrigerant temperature and increase in the temperature difference also becomes faster. The temperature difference threshold value ($\Delta T_{th}$) indicates a timing at which the drive limitation is applied to the power conversion apparatus 3 before the temperature of the power conversion apparatus 3 reaches an allowable temperature in a state where the temperature of the power conversion apparatus 3 rises in a low-temperature state, by a temperature difference.

When the temperature difference ($\Delta T$) is equal to or lower than the temperature difference threshold value ($\Delta T_{th}$), the controller 10 executes the control of Step S5. On the other hand, when the temperature difference ($\Delta T$) is higher than the temperature difference threshold value ($\Delta T_{th}$), the controller 10 executes the control of Step S6.

In Step S5, the controller 10 compares the device temperature (T2) and temperature threshold value ($T_{th1}$). When the device temperature (T2) is higher than the temperature threshold value ($T_{th1}$), the controller 10 executes the control of Step S6. On the other hand, when the device temperature (T2) is equal to or lower than the temperature threshold value ($T_{th1}$), the controller 10 executes the control of Step S8. The temperature threshold value ($T_{th1}$) is a threshold value for determining whether or not to execute a first protection processing described later, and is set to a temperature higher than the temperature difference threshold value ($\Delta T_{th}$). The temperature difference threshold value ($\Delta T_{th}$) is a threshold value for a low-temperature environment, and the temperature threshold value ($T_{th1}$) is a threshold value for a high-temperature environment.

In Step S6, the controller 10 determines whether or not the switching frequency can be limited based on a current drive state of the motor. The controller 10 confirms the drive state of the motor by obtaining a motor rotation speed from the power conversion apparatus 3. The switching frequency is a carrier frequency for controlling ON and OFF of the switching element. When the temperature difference ($\Delta T$) is higher than the temperature difference threshold value ($\Delta T_{th}$), or when the device temperature (T2) is higher than the temperature threshold value ($T1_{th1}$), in order to suppress rise in the power module temperature, drive limitation is applied to the power module. By applying drive limitation to the power module, limitation is also imposed to the drive of the motor. The drive limitation is executed by making the carrier frequency lower than the present frequency. However, when the switching frequency is set low in a state where the rotation speed of the motor is high, control divergence may occur. For this reason, in the control of Step S6, whether or not the drive state of the motor is in a state where the switching frequency can be set low is determined. Specifically, the controller 10 compares the present motor rotation speed and rotation speed threshold value. The controller 10 determines that the switching frequency can be limited when the present motor rotation speed (N) is lower than the rotation speed threshold value ($N_{th}$), and determines that the switching frequency cannot be limited when the present motor rotation speed is equal to or higher than the rotation speed threshold value. The rotation speed threshold value is set in advance, and the value may be set according to the torque of the motor.

When determining that switching frequency can be limited, in Step S7, the controller 10 executes a first protection processing. The first protection processing is a processing for applying drive limitation to the motor by limiting the switching frequency. Specifically, the controller 10 obtains a present output torque and a present motor rotation speed of the motor from the power conversion apparatus 3. A selectable switching frequency is set in advance and the selectable switching frequency varies depending on the drive state of the motor.

For example, as the selectable switching frequency, three frequencies ($f_{sw1}$, $f_{sw2}$, $f_{sw3}$) are set in advance. However, frequency ($f_{sw3}$) is the highest and frequency ($f_{sw1}$) is the lowest. Also, a rotation speed threshold value ($N_{th\_L}$) lower than the rotation speed threshold value ($N_{th}$) is set in advance. Then, according to the present rotation speed of the motor, selectable switching frequency is decided. When the present rotation speed N of the motor is higher than the rotation speed threshold value ($N_{th}$), a selectable switching frequency is only $f_{sw3}$ and in this case, the state corresponds to a state where the switching frequency cannot be limited. When the present rotation speed is equal to or lower than the rotation speed threshold value ($N_{th}$) and higher than the rotation speed threshold value ($N_{th\_L}$), the selectable switching frequencies are frequency ($f_{sw3}$) and frequency ($f_{sw2}$). Then, when the present carrier frequency is higher than frequency ($f_{sw2}$) and lower than frequency ($f_{sw3}$), for example, the controller 10 sets the carrier frequency to frequency ($f_{sw2}$) and applies limitation to the carrier frequency. More, when the present rotation speed of the motor is equal to or lower than the rotation speed threshold value ($N_{th\_L}$), selectable switching frequencies are frequency ($f_{sw1}$), frequency ($f_{sw2}$), and frequency ($f_{sw3}$). For example, when the present carrier frequency is higher than frequency ($f_{sw3}$), the controller 10 sets the carrier frequency to frequency ($f_{sw3}$), and applies limitation to the carrier frequency. In other words, when there is a plurality of selectable switching frequencies according to the present rotation speed of the motor, the controller 10 sets the carrier frequency lower than the present carrier frequency. In this way, loss can be suppressed and generation of heat in the power module can be suppressed. The selectable switching frequency is not limited to the motor rotation speed but may be decided in accordance with a torque of the motor.

In Step S8, the controller 10 compares the device temperature (T2) and a temperature threshold value ($T_{\_th2}$). The temperature threshold value ($T_{\_th2}$) is a threshold value for determining whether or not to execute a second protection processing described later and is set to a temperature higher than the temperature threshold value ($T_{\_th1}$). When the device temperature (T2) is higher than the temperature threshold value ($T_{\_th2}$), the controller 10 executes the control of Step S9. On the other hand, when the device temperature (T2) is equal to or lower than the temperature threshold value ($T_{\_th2}$), the controller 10 executes the control of Step S10.

In Step S9, the controller 10 executes the second protection processing. The second protection processing is a processing for applying limitation to an output torque from the motor by setting an output torque corresponding to a request torque when the device temperature (T2) reaches the temperature threshold value ($T_{\_th2}$) as a maximum output from the motor. Specifically, when the device temperature (T2) reaches the temperature threshold value ($T_{\_th2}$), the controller 10 sends a command signal to the controller of the power conversion apparatus 3 to change the upper limit of the torque command value according to the request torque to a present torque value. The controller of the power conversion apparatus 3, sets the present torque command value to the upper limit when the command signal is received. After the upper limit is set, even when a request torque that exceeds the upper limit of the torque command is input by accelerator operation by a driver, the controller generates a switching signal that corresponds to the present rotation speed of the motor and the present current of the motor after setting the torque command value to the upper limit, and controls the switching element. In this way, limitation is applied to the request torque and the output torque of the motor is suppressed, and as a result, temperature of the power module can be suppressed.

In Step S10, the controller 10 compares the device temperature (T2) and an upper-limit temperature ($T_{\_fail}$). The upper-limit temperature ($T_{\_fail}$) indicates an upper limit of the temperature allowable to the power module and is set to a temperature higher than the temperature threshold value ($T_{\_th1}$) and temperature threshold value ($T_{\_th2}$). When the device temperature (T2) is higher than the upper-limit temperature ($T_{\_fail}$), the controller 10 executes the control of Step S11. On the other hand, when the device temperature (T2) is equal to or lower than the upper-limit temperature ($T_{\_fail}$), the controller 10 ends the control flow.

In Step S11, the controller 10 sends a fail-safe signal for forcibly stopping the motor to the controller inside the power conversion apparatus 3. The controller inside the power conversion apparatus 3, when the fail-safe signal is received, stops operation of the power conversion apparatus 3 (fail-safe processing). In this way, it can be prevent that the temperature of the power module exceeds the upper limit.

Figure 3A:
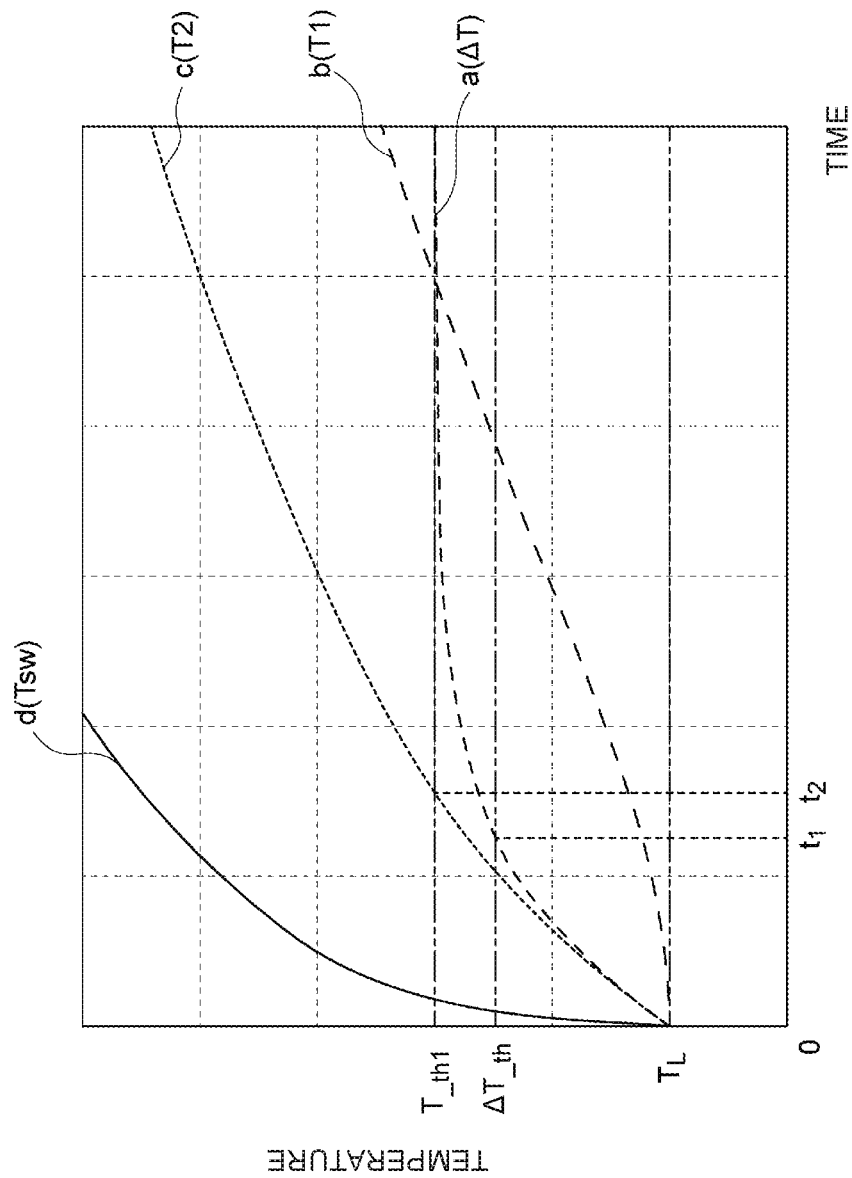
FIG. 3A is a graph illustrating temperature characteristics when an environmental temperature is low temperature ($T_L$).
Figure 3B:
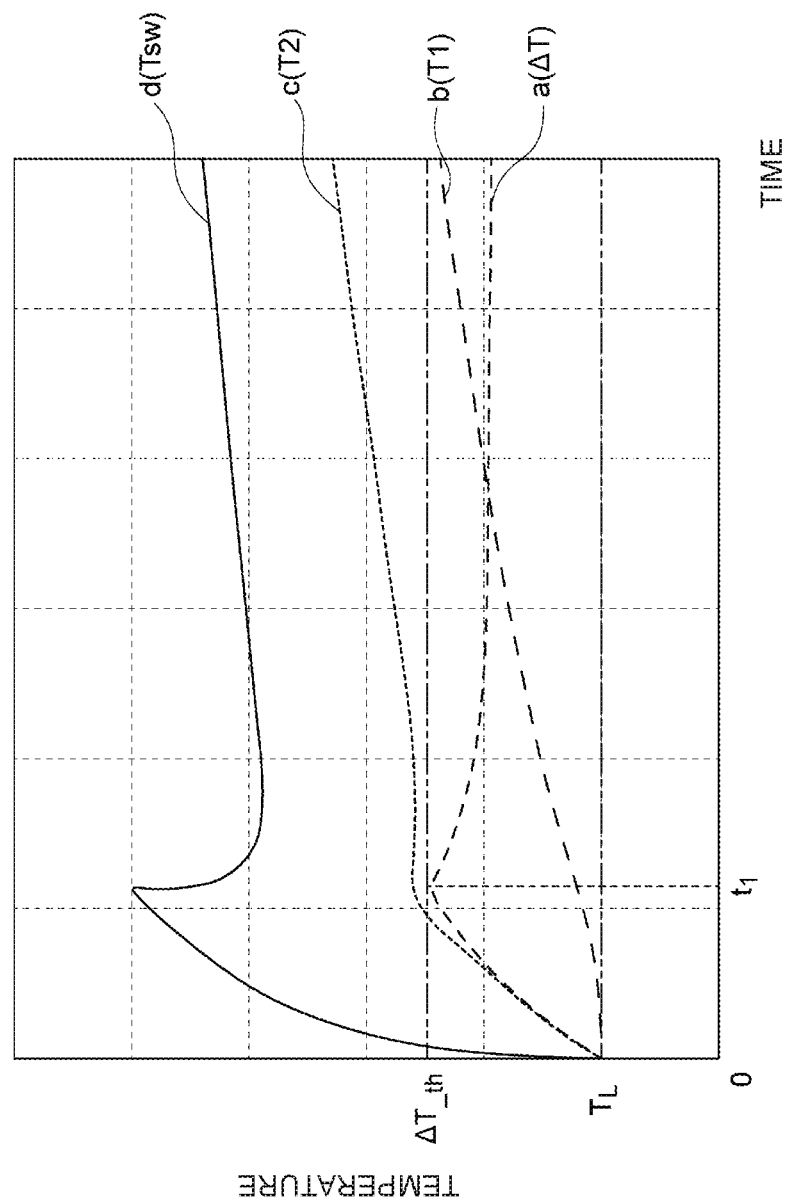
FIG. 3B is a graph illustrating temperature characteristics when the environmental temperature is low temperature ($T_L$).
Figure 4A:
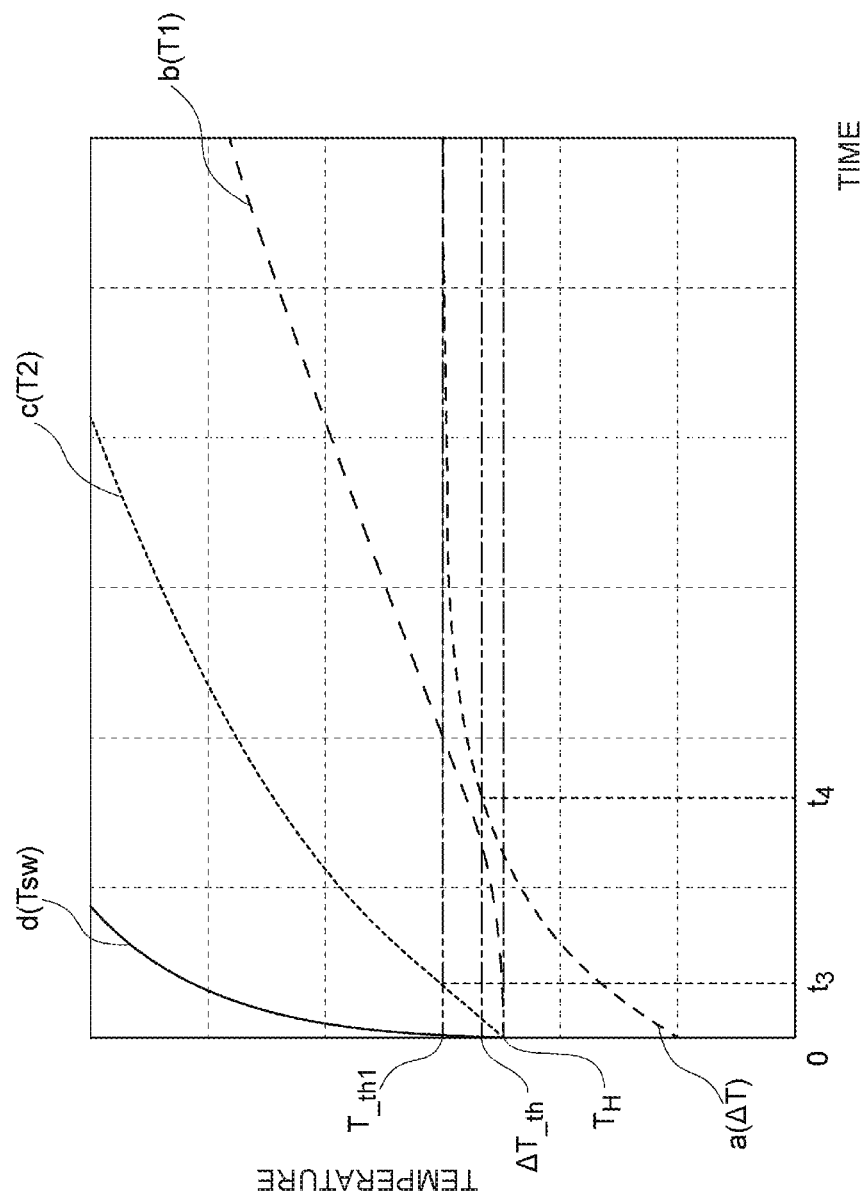
FIG. 4A is a graph illustrating temperature characteristics when the environmental temperature is high temperature ($T_H$).
Figure 4B:
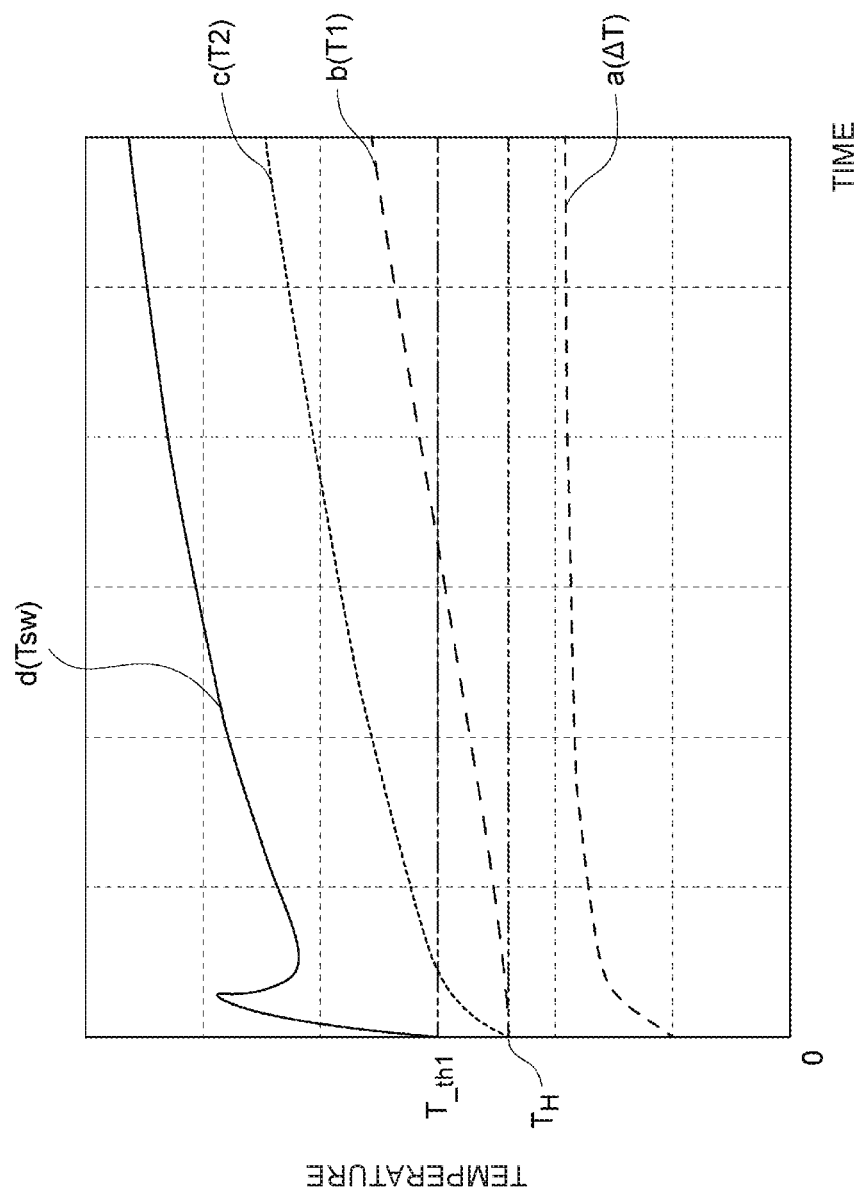
FIG. 4B is a graph illustrating temperature characteristics when the environmental temperature is high temperature ($T_H$).

Next, using FIG. 3A, FIG. 3B, FIG. 4A, and FIG. 4B, a relationship between the first protection processing and temperature will be explained. FIG. 3A and FIG. 3B indicate temperature characteristics when environmental temperature is low temperature ($T_L$), and FIG. 4A and FIG. 4B indicate temperature characteristics when the environmental temperature is high temperature ($T_H$). In FIG. 3A, FIG. 3B, FIG. 4A, and FIG. 4B, graph a illustrates characteristics of a temperature difference (ΔT), graph b illustrates characteristics of the refrigerant temperature (T1) detected by the temperature sensor 22, graph c illustrates characteristics of the device temperature (T2) detected by the temperature sensor 21, and graph d illustrates characteristics of an actual temperature ($T_{sw}$) of the switching element. More, a horizontal axis indicates time and vertical axis indicates temperature. FIG. 3A and FIG. 4A illustrate characteristics when the device protection apparatus according to the present embodiment is not provided to the drive system (comparative example). FIG. 3B and FIG. 4B illustrate characteristics when the drive protection apparatus according to the present embodiment is provided to the drive system.

As shown in FIG. 3A, when the environmental temperature is low, the device temperature (T2) reaches the temperature threshold value ($T_{\_th1}$) at the point of time t2. On the other hand, the temperature difference (ΔT) reaches the temperature difference threshold value ($\Delta T_{th}$) at a point of time t1, which is earlier than time t2. In other words, at a low-temperature, a temperature difference between the refrigerant temperature and device temperature increases and the temperature difference (ΔT) reaches the temperature difference threshold value ($\Delta T_{th}$) before the device temperature (T2) reaches the temperature threshold value ($T_{th1}$). Also, as shown in FIG. 3B, in the present embodiment, since the first protection processing is executed on the time the temperature difference (ΔT) reaches the temperature difference threshold value ($\Delta T_{th}$), loss is reduced before the temperature of the switching element reaches high temperature and consequently, and the switching element temperature ($T_{sw}$) can be suppressed. On the other hand, in a comparative example which the first protection processing is not executed, the switching element temperature ($T_{sw}$) continues to rise on and after time t1.

As shown in FIG. 4A, when the environmental temperature is high, the device temperature (T2) reaches the temperature threshold value ($T_{th1}$) (time $t_3$) before the temperature difference (ΔT) reaches the temperature difference threshold value ($\Delta T_{th}$) (time $t_4$). Then, as shown in FIG. 4B, in the present embodiment, since the first protection processing is executed on the time the device temperature (T2) reaches the temperature threshold value ($T_{th1}$), loss is reduced before the temperature of the switching element reaches a high temperature and consequently, and the switching element temperature ($T_{sw}$) can be suppressed.

Figure 5A:
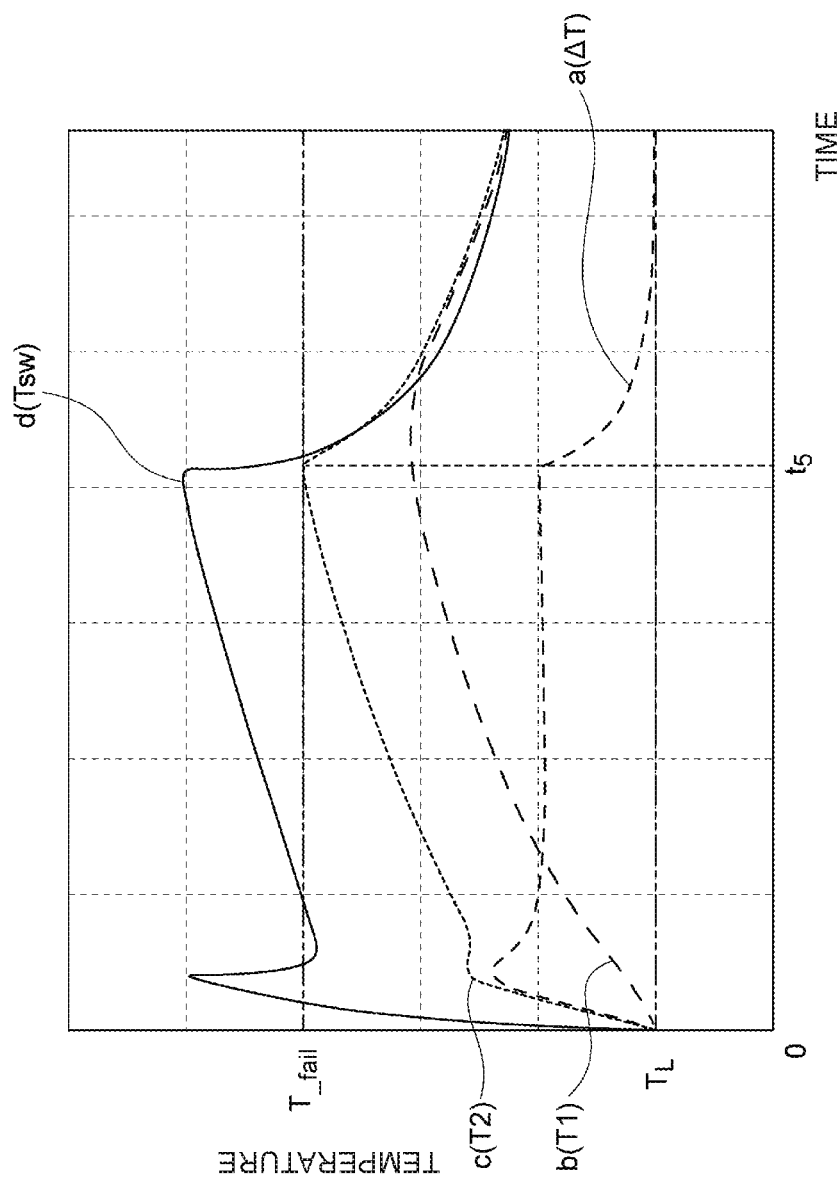
FIG. 5A is a graph illustrating temperature characteristics when the environmental temperature is low temperature ($T_L$).
Figure 5B:
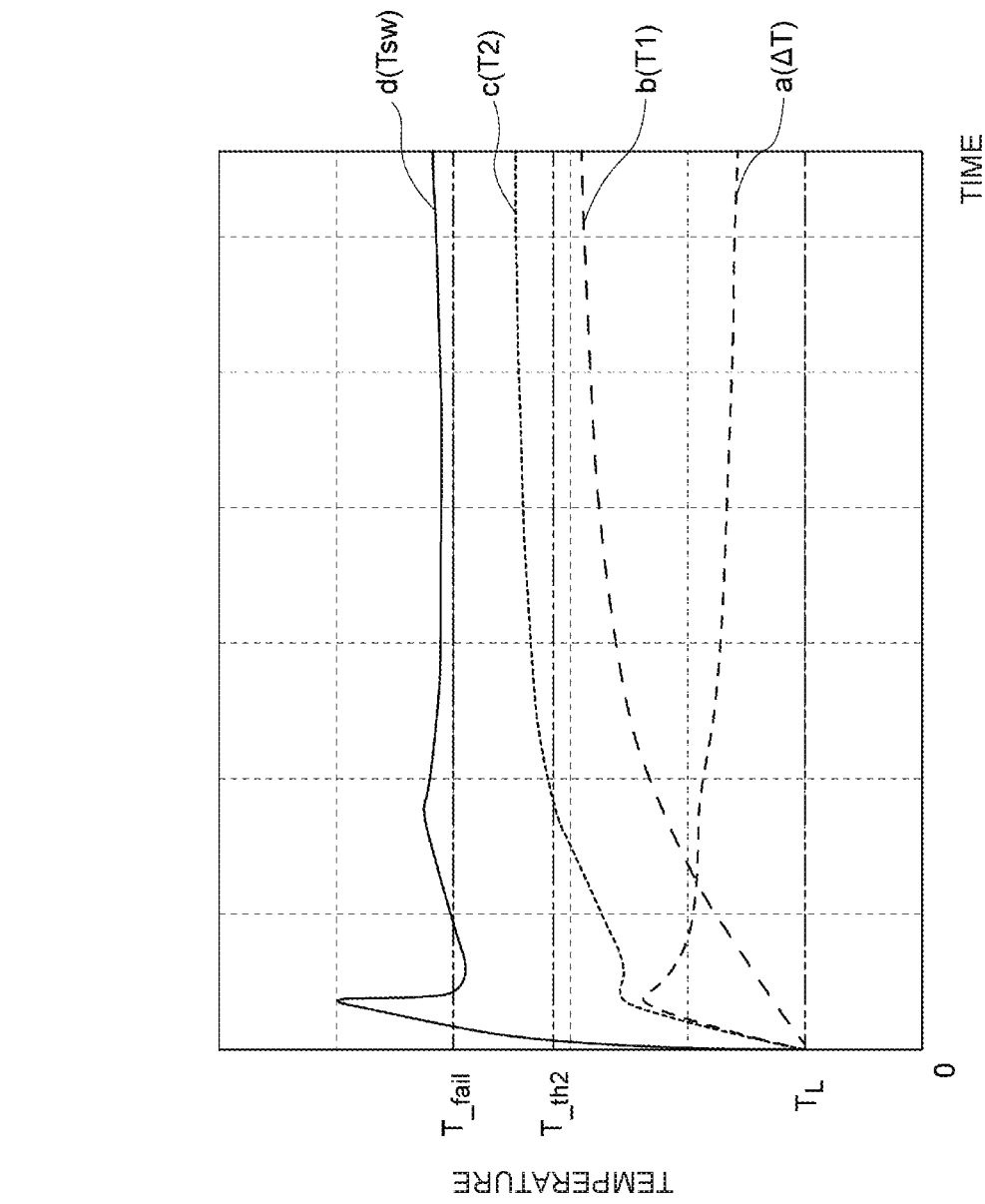
FIG. 5B is a graph illustrating temperature characteristics when the environmental temperature is low temperature ($T_L$).
Figure 6A:
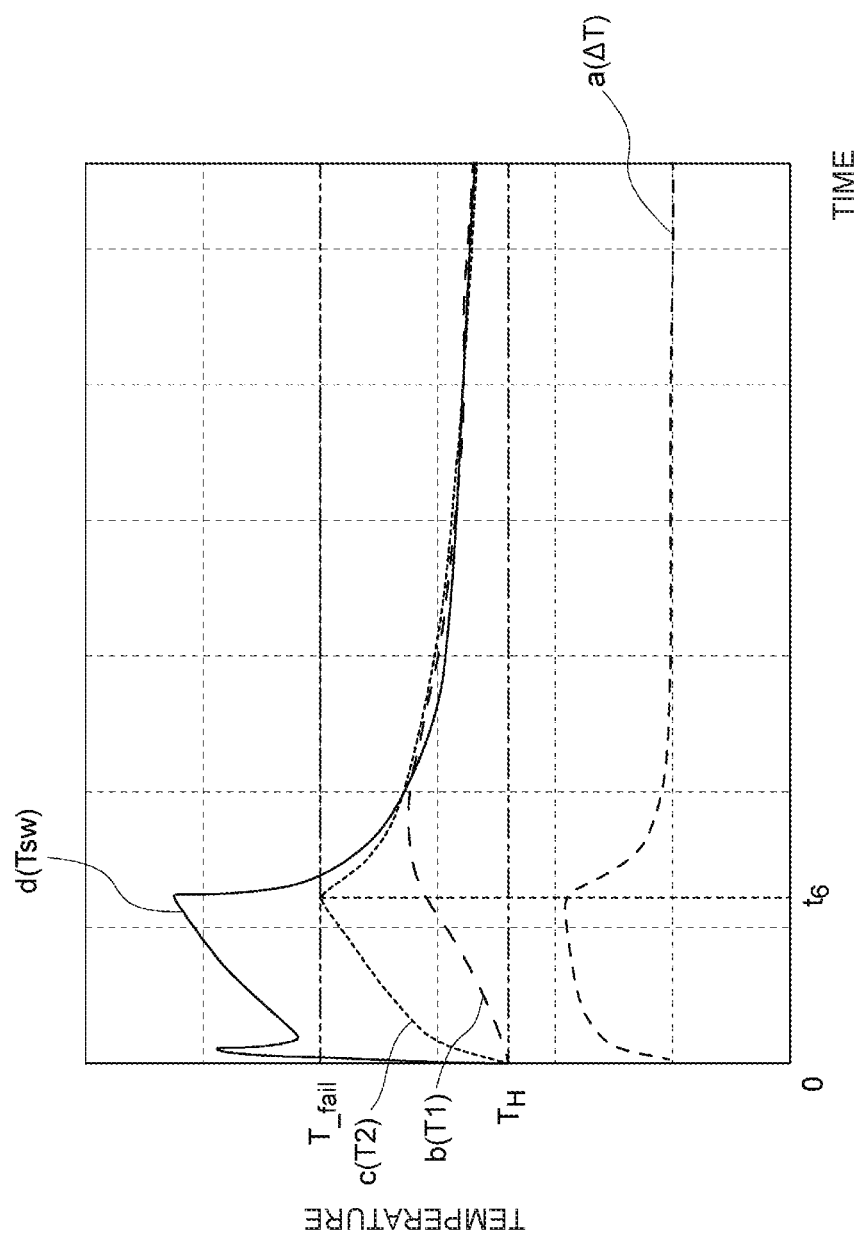
FIG. 6A is a graph illustrating temperature characteristics when the environmental temperature is high temperature ($T_H$).
Figure 6B:
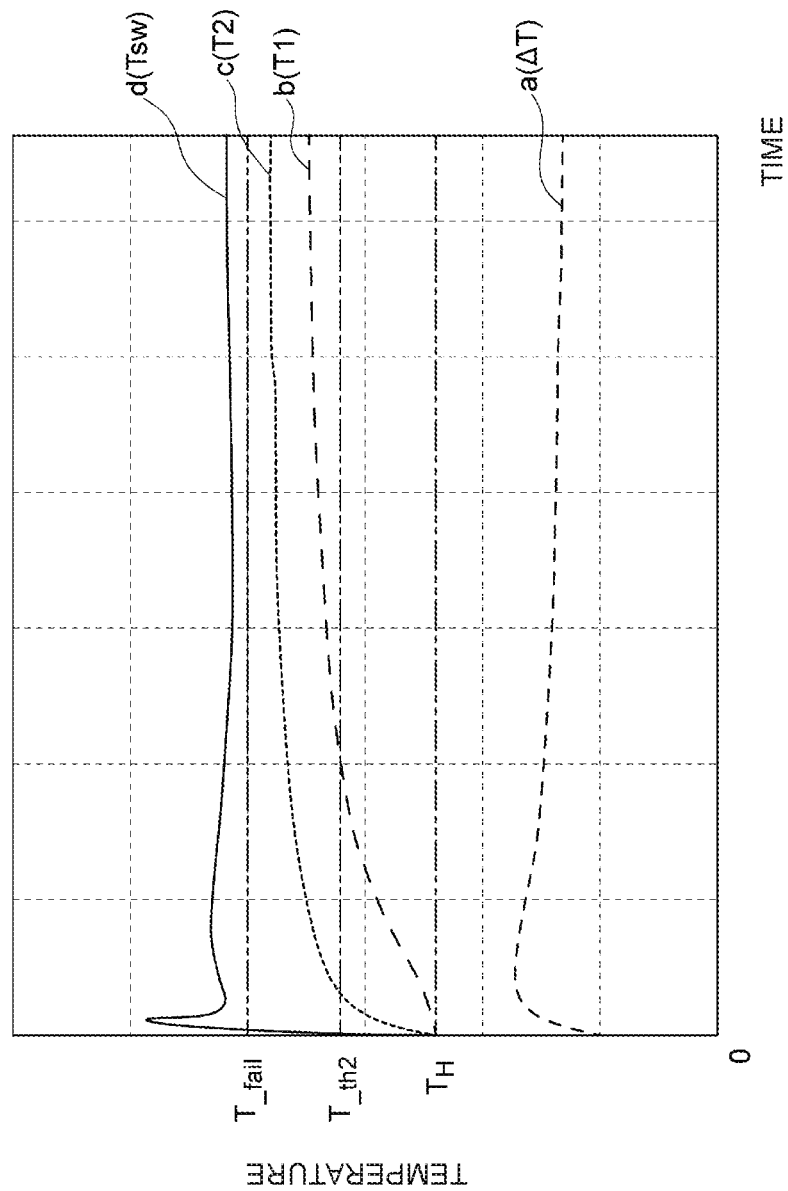
FIG. 6B is a graph illustrating temperature characteristics when the environmental temperature is high temperature ($T_H$).

Next, using FIG. 5A, FIG. 5B, FIG. 6A, and FIG. 6B, a relationship between the second protection processing and temperature will be explained. FIG. 5A and FIG. 5B illustrate temperature characteristics when an environmental temperature is low ($T_L$), and FIG. 6A and FIG. 6B illustrate temperature characteristics when the environmental temperature is high ($T_H$). In FIG. 5A, FIG. 5B, FIG. 6A, and FIG. 6B, graph a illustrates characteristics of a temperature difference (ΔT), graph b illustrates characteristics of the refrigerant temperature (T1) detected by the temperature sensor 22, graph c illustrates characteristics of the device temperature (T2) detected by the temperature sensor 21, and graph d illustrates characteristics of an actual temperature ($T_{sw}$) of the switching element. More, a horizontal axis indicates time and a vertical axis indicates temperature. FIG. 5A and FIG. 6A illustrate characteristics of a case where the drive protection apparatus of the present embodiment only executes the first protection processing, and FIG. 5B and FIG. 6B illustrate characteristics of a case where the first protection processing and the second protection processing of the device protection apparatus according to the present embodiment are executed.

As shown in FIG. 5A, when the temperature of the power module continues to rise after the first protection processing is executed, the device temperature (T2) reaches the upper-limit temperature ($T_{fail}$) at the point of time ($t_5$), and thus a fail-safe processing is executed. On the other hand, in the present embodiment, as shown in FIG. 5B, the second protection processing is executed at the time the device temperature (T2) reaches the temperature threshold value ($T_{th2}$) before the device temperature (T2) reaches the upper-limit temperature ($T_{fail}$), and using an output at the time the device temperature (T2) reaches the temperature threshold value ($T_{th2}$) as an upper limit, torque limitation is applied. In this way, temperature rise of the switching element can be suppressed and operable time of the power conversion apparatus 3 can be extended.

As shown in FIG. 6A, when the temperature of the power module continues to rise after the first protection processing is executed, the device temperature (T2) reaches the upper-limit temperature ($T_{fail}$) at the point of time ($t_6$), and thus the fail-safe processing is executed. On the other hand, in the present embodiment, as shown in FIG. 6B, at the time the device temperature (T2) reaches the temperature threshold temperature ($T_{th2}$) before the device temperature (T2) reaches the upper-limit temperature ($T_{fail}$), the second protection processing is executed and using an output at the time the device temperature (T2) reaches the temperature threshold value ($T_{th2}$) as the upper limit, the torque limitation is applied. In this way, even when the environmental temperature is high temperature, temperature rise of the switching element can be suppressed and operable time of the power conversion apparatus 3 can be extended.

As described above, the device protection apparatus according to the present embodiment detects each of a temperature of a refrigerant used for cooling a device such as a power module, or the like and a temperature of the device, calculates a temperature difference between the detected temperature of the refrigerant and detected temperature of the device, applies drive limitation to the device when the temperature difference is higher than the temperature difference threshold value ($\Delta T_{th}$), and applies the drive limitation to the device when the detected temperature of the device is higher than the temperature threshold value ($T_{th1}$). In this way, temperature rise of the heat-generation part can be suppressed and the heat load applied to the heat-generation part and device can be suppressed. Also, operation time of the device can be extended.

More, in the present embodiment, when the detected temperature of the device is higher than the temperature threshold value ($T_{th2}$), the controller sets an output of the device at the time the increased detected temperature of the device reaches the temperature threshold value ($T_{th2}$) as the maximum output from the device. In this way, an output that is an immediate cause of rising temperature of the heat-generation part can be limited and operable time of the device can be extended.

Also, in the present embodiment, the controller 10 sets a switching frequency of the switching element to a frequency lower than the present frequency for the drive limitation of the device. In this way, by reducing loss, temperature rise can be suppressed without applying limitation to the output of the power conversion apparatus.

Additionally, in the present embodiment, the controller 10 applies limitation to a switching frequency of the switching element according to the rotation speed of the motor for the drive limitation of the device. In this way, an optimal frequency according to the motor rotation speed can be set and control divergence can be prevented.

Further, in the present embodiment, the controller stops operation of the device when the detected temperature of the device is equal to or higher than the temperature threshold value ($T_{fail}$). In this way, generation of abnormalities in the device can be prevented.

Figure 7:
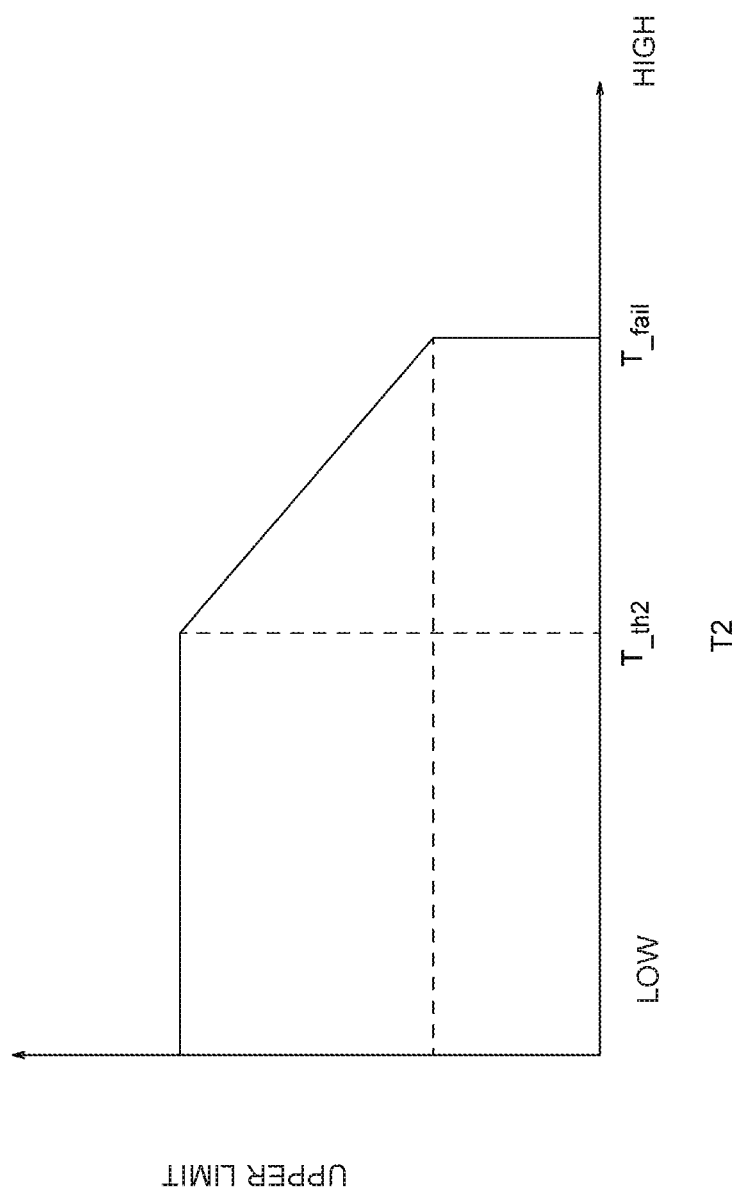
FIG. 7 is a graph illustrating a relationship between temperatures and upper limit values according to a modified example of the present embodiment.

Furthermore, as a modified example of the present embodiment, the second protection processing is a processing for setting an upper-limit output from the motor to a value lower than a second limit value, when the device temperature rises after setting the upper-limit output from the motor to a first limit value and applying limitation to the output of the motor. FIG. 7 is a graph illustrating a relationship between the device temperatures and the limit values of the upper-limit output from the motor.

As shown in FIG. 7, when the device temperature (T2) is equal to or lower than the temperature threshold value ($T_{\_th2}$), the upper-limit output from the motor is set to $P_{th1}$. For this reason, the output from the motor is suppressed to the upper limit ($P_{th1}$) or lower. More, when the device temperature (T2) becomes higher than the temperature threshold value ($T_{\_th2}$) in a state where the output from the motor is limited to the upper limit ($P_{th1}$), the controller 10, based on the relationship shown in FIG. 7, applies further limitation to the upper-limit output from the motor. The controller 10 stores a map showing the relationship of FIG. 7. The controller 10, while referencing the map, specifies the upper limit ($P_{th}$) that corresponds to the device temperature (T2>$T_{\_th2}$), and with the specified upper limit, applies limitation to the output from the motor. In this way, the device protection apparatus according to the modified example can suppress temperature rise in the heat-generation part. Also, since the output is not completely stopped, the minimum power performance can be maintained.

Figure 8:
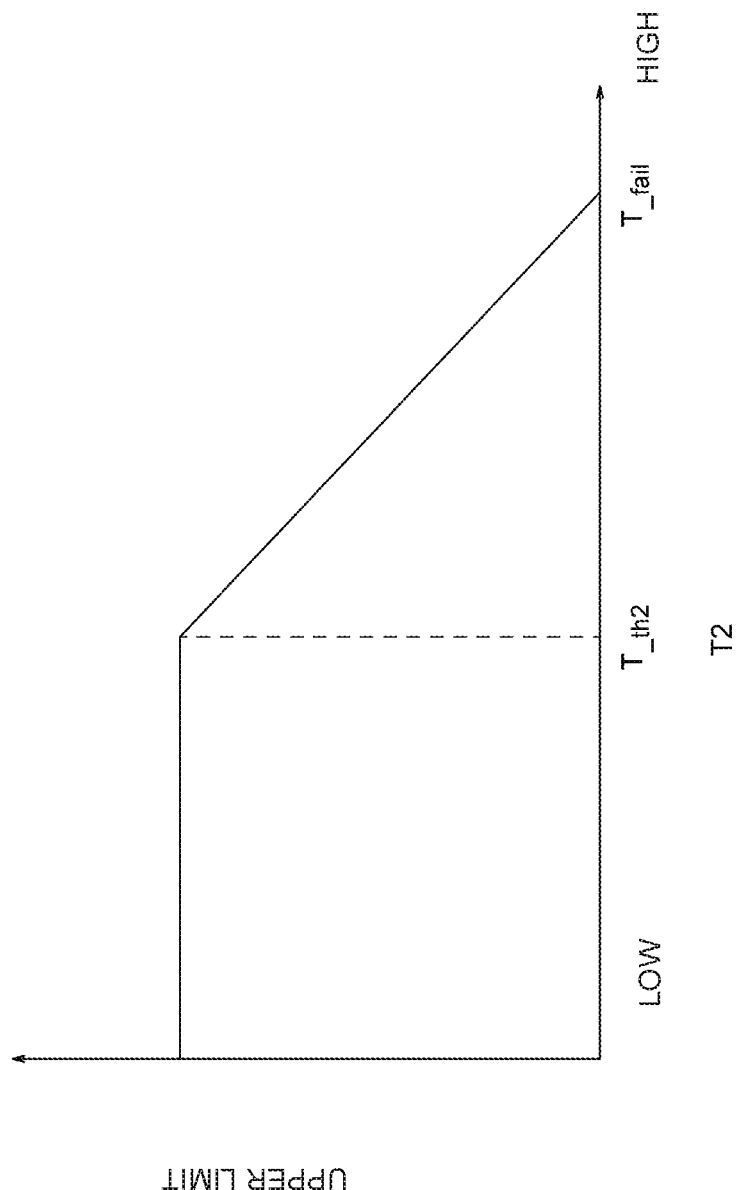
FIG. 8 is a graph illustrating a relationship between temperatures and upper limit values according to a modified example of the present embodiment.

Additionally, the relationship between the device temperature and upper limit may have the relationship as shown in the graph of FIG. 8. In FIG. 8, as the device temperature (T2) becomes higher than the temperature threshold value ($T_{\_th2}$), the upper limit of the output from the motor becomes smaller in a proportional relation.

DESCRIPTION OF REFERENCE NUMERALS

1 . . . power supply
2 . . . load
3 . . . power conversion apparatus
4 . . . cooling apparatus
10 . . . controller
21, 22 . . . temperature sensor

The invention claimed is:

1. A device protection apparatus comprising:
a first sensor for detecting temperature of a refrigerant used for cooling a device including a heat-generation part;
a second sensor for detecting temperature of the device; and
a controller that applies drive limitation to the device based on a first detected temperature detected by the first sensor, and a second detected temperature detected by the second sensor,
wherein the controller
calculates a temperature difference between the first detected temperature and the second detected temperature,
applies the drive limitation to the device when the temperature difference is higher than a predetermined temperature difference threshold value, and
applies the drive limitation to the device when the temperature difference is lower than the predetermined temperature difference threshold value and the second detected temperature is higher than a predetermined first temperature threshold value.

2. The device protection apparatus according to claim 1, wherein
when the second detected temperature is higher than a predetermined second temperature threshold value, the controller sets an output at the time the increased second detected temperature reaches the second temperature threshold value as a maximum output from the device.

3. The device protection apparatus according to claim 1, wherein
the device includes a switching element,
the second sensor detects temperature of the switching element, and
the controller sets a switching frequency of the switching element to a frequency lower than a present frequency for the drive limitation.

4. The device protection apparatus according to claim 1, wherein
the device includes a switching element connected to a motor,
the second sensor detects temperature of the switching element, and
the controller applies limitation to a switching frequency of the switching element according to a rotation speed of the motor for the drive limitation.

5. The device protection apparatus according to claim 1, wherein
the controller
sets an upper-limit output from the device to a first limit value for the drive limitation, and
sets an upper-limit output from the device to a second limit value lower than the first limit value when the second detected temperature rises after applying limitation to an output from the device.

6. The device protection apparatus according to claim 1, wherein
the controller stops operation of the device when the second detected temperature is equal to or higher than a predetermined upper limit.

7. A device protection method of protecting a device including a heat-generation part by using a processor, the protection method comprising:
detecting temperature of a refrigerant used for cooling the device using a first sensor;
detecting temperature of the device using a second sensor;
calculating a temperature difference between a detected temperature of the refrigerant detected by the first sensor and a detected temperature of the device detected by the second sensor;
applying drive limitation to the device when the temperature difference is higher than a predetermined temperature difference threshold value; and
applying the drive limitation to the device when the temperature difference is lower than the predetermined temperature difference threshold value and the detected temperature of the device is higher than a predetermined temperature threshold value.

* * * * *